US006900461B2

United States Patent
Inoue et al.

(10) Patent No.: US 6,900,461 B2
(45) Date of Patent: May 31, 2005

(54) CONDUCTIVE THIN FILM FOR SEMICONDUCTOR DEVICE, SEMICONDUCTOR DEVICE, AND METHOD OF MANUFACTURING THE SAME

(75) Inventors: Kazuyoshi Inoue, Sodegaura (JP); Shigeo Matsuzaki, Sodegaura (JP)

(73) Assignee: Idemitsu Kosan Co., Ltd. (JP)

( * ) Notice: Subject to any disclaimer, the term of this patent is extended or adjusted under 35 U.S.C. 154(b) by 0 days.

(21) Appl. No.: 10/344,659

(22) PCT Filed: May 10, 2002

(86) PCT No.: PCT/JP02/04556

§ 371 (c)(1),
(2), (4) Date: Feb. 14, 2003

(87) PCT Pub. No.: WO02/103768

PCT Pub. Date: Dec. 27, 2002

(65) Prior Publication Data

US 2004/0031963 A1 Feb. 19, 2004

(30) Foreign Application Priority Data

Jun. 14, 2001 (JP) ........................................ 2001-179567

(51) Int. Cl.[7] .............................................. H01L 29/04
(52) U.S. Cl. ............................ 257/59; 257/59; 257/770
(58) Field of Search ............................. 257/59, 60, 66; 438/151, 166, 152; 427/69, 49

(56) References Cited

U.S. PATENT DOCUMENTS

| 5,220,186 | A | 6/1993 | Kasai et al. ................. 257/284 |
| 6,188,120 | B1 | 2/2001 | Andricacos et al. |
| 6,376,861 | B1 * | 4/2002 | Yaegashi et al. .............. 257/59 |
| 6,486,009 | B2 * | 11/2002 | Yang et al. .................. 438/151 |
| 2001/0035528 | A1 | 11/2001 | Yang et al. .................... 257/59 |

FOREIGN PATENT DOCUMENTS

| EP | 0 435 801 A2 | 7/1991 | |
| JP | 354060210 A * | 5/1979 | ................. 75/238 |
| JP | 2001-230418 | 8/2001 | |
| JP | 2001-257178 | 9/2001 | |
| JP | 2002-083987 | 3/2002 | |
| TW | 447138 | 7/2001 | |

* cited by examiner

Primary Examiner—David Nelms
Assistant Examiner—Thinh T Nguyen
(74) Attorney, Agent, or Firm—Parkhurst & Wendel, L.L.P.

(57) ABSTRACT

A semiconductor device 1 obtained by depositing, on a substrate 2, a gate electrode 4 formed by a conductive thin film containing Mo atoms and Ag atoms, a gate insulating film 6, an α-Si:H(i) film 8, a channel protection layer 10, an α-Si:H(n) film 12, a source/drain electrode 14 formed by a conductive thin film containing Mo atoms and Ag atoms, a source/drain insulating film 16, and a drive electrode 18. By using a conductive thin film containing Mo atoms and Ag atoms, the gate electrode 4 and the source/drain electrode 14 are formed to manufacture the semiconductor device 1. Thus, the conductive thin film for a semiconductor device, having high adhesion strength to a substrate, an insulating layer, and the like, a semiconductor device which operates stably without deteriorating the performance, and a method of efficiently manufacturing the conductive thin film and the semiconductor device can be provided.

11 Claims, 1 Drawing Sheet

CONDUCTIVE THIN FILM FOR SEMICONDUCTOR DEVICE, SEMICONDUCTOR DEVICE, AND METHOD OF MANUFACTURING THE SAME

This Application is a 371 of PCT/JP02/04556 May 10, 2002.

TECHNICAL FIELD

The present invention relates to a conductive thin film for a semiconductor device such as a semiconductor transistor, a semiconductor device, and a method of manufacturing the same.

BACKGROUND ART

A TFT is a very important component as a main component of a display of a portable personal computer, a laptop personal computer, a television, or the like.

Companies manufacture TFTs by their methods. Since the process of manufacturing a TFT is complicated and various metals and metal oxides are deposited a plurality of times, simplification of the process is demanded.

In a process of manufacturing a conventional TFT array, as materials of a gate electrode and a source/drain electrode, metals such as Cr and TaW are used.

Although Cr is easily processed, there is a problem that Cr is easily corroded. Although TaW is resistive to corrosion and the like, it has a problem of high electric resistance and the like.

Consequently, a TFT array using wires made mainly of aluminum as a metal which is easily processed and has low electric resistance has been proposed.

However, when an aluminum electrode is in direct contact with a silicon layer and a drive electrode, problems occur such that aluminum is diffused into the silicon layer, thereby deteriorating device performance, and aluminum is oxidized and converted into alumina, it increases the electric resistance with the drive electrode, and the device does not operate normally.

Attempt is being made to reduce the contact resistance with the drive electrode by sandwiching the aluminum electrode by Mo or Ti.

In order to sandwich the aluminum electrode, however, a film made of Mo or Ti has to be formed first, after that, a film of a metal containing aluminum as a main component is formed, and a film made of Mo or Ti has to be formed again. Consequently, there is a drawback that the process is complicated.

On the other hand, attempt is also being made to solve the problem by using a silver or copper electrode. However, silver and copper have low adhesion to with a silicon nitride film, a silicon wafer, or the like which is made of glass or an insulating film. It causes a problem such that silver and copper come off during the manufacturing process.

An object of the invention is to provide a conductive thin film for a semiconductor device having strong adhesion to a substrate, an insulating layer, or the like, a semiconductor device that stably operates without deteriorating performance, and a method of efficiently manufacturing the film and the device.

The inventors herein have studied wholeheartedly and, as a result, found that the object can be achieved by using a conductive thin film containing Ag atoms and Mo atoms for a gate electrode and/or a source/drain electrode of a semiconductor device.

DISCLOSURE OF INVENTION

According to the present invention, a conductive thin film containing Ag atoms and Mo atoms, having strong adhesion to a substrate, an insulating layer, and the like, and particularly preferably used for a semiconductor device is provided.

A semiconductor device in which at least one of a gate electrode and a source/drain electrode is made by the conductive thin film is provided.

By forming a gate electrode and/or a source/drain electrode from the conductive thin film, even when an electrode wire is in direct contact with a silicon layer, diffusion of metal atoms into the silicon layer can be prevented, so that the performance of a semiconductor device obtained does not deteriorate.

Further, even when a drive electrode is formed directly on the electrode wire, contact resistance can be prevented from being increased. Thus, a semiconductor device which operates stably can be obtained.

Particularly, an example of the semiconductor device is a semiconductor transistor including a field effect transistor such as a TFT. In an example of a concrete structure, a gate electrode, a semiconductor layer, a source/drain electrode, and a drive electrode are disposed on a substrate.

In a conductive thin film for a semiconductor device (conductive thin film) according to the invention, preferably, the film contains 0.5 to 70% by weight of Mo atoms.

Further, more preferably, the conductive thin film of the invention contains 30 to 99.5% by weight of Ag atoms and 0.5 to 70% by weight of Mo atoms. Further more preferably, the conductive thin film contains 70 to 99% by weight of Ag atoms and 1 to 30% by weight of Mo atoms. Further more preferably, the conductive thin film contains 85 to 98% by weight of Ag atoms and 2 to 15% by weight of Mo atoms.

By setting the Ag atoms and Mo atoms within the ranges, the adhesion between the conductive thin film and a substrate or an insulating layer can be largely increased. Consequently, the conductive thin film can be preferably applied to a semiconductor device.

In the case of using the conductive thin film of the invention for a semiconductor device, at least one of the gate electrode and the source/drain electrode is formed by the conductive thin film containing Ag atoms and Mo atoms at any of the rates.

In the conductive thin film of the invention, preferably, resistivity is 5 $\mu\Omega$·cm or less.

Further, in a semiconductor device of the invention, preferably, at least one of the gate electrode and the source/drain electrode is formed by the conductive thin film containing Ag atoms and Mo atoms and having resistivity of 5 $\mu\Omega$·cm or less.

By setting the resistivity to be within the range, delay of a signal for driving a liquid crystal or the like can be effectively prevented.

In the conductive thin film of the invention, preferably, the Mo atoms are Mo atoms derived from an Mo/Al compound, an Mo/Be compound, an Mo/Ga compound, an Mo/Ge compound, an Mo/Ir compound, an Mo/Pt compound, an Mo/Re compound, an Mo/Si compound, an MoW alloy, an MoTa alloy, or an MoRh alloy.

When the Mo atoms are derived from any of such materials, dispersibility of the Mo atoms is improved and stability of the conductive thin film can be improved.

Another aspect of the present invention relates to a method of manufacturing a conductive thin film, wherein the conductive thin film is formed by sputtering. In the method, it is preferable to use a sputtering target containing Ag atoms and Mo atoms. Further another aspect of the invention relates to a method of manufacturing a semiconductor device, for forming at least one of a gate electrode and a source/drain electrode by a conductive thin film formed by using the method of manufacturing the conductive thin film.

By forming a film by sputtering, a process of depositing Mo/Al/Mo, Ti/Al/Ti or the like can be simplified and a semiconductor device can be manufactured efficiently.

By using a sputtering target mainly made of Ag to which an Mo compound such as an Mo/Al compound, an Mo/Be compound, an Mo/Ga compound, an Mo/Ge compound, an Mo/Ir compound, an Mo/Pt compound, an Mo/Re compound, an Mo/Si compound, an MoW alloy, an MoTa alloy, or an MoRh alloy is added, dispersibility of Mo is improved and a film can be stably formed by sputtering.

According to the method, adhesiveness of the gate electrode and the source/drain electrode to a substrate (for example, glass substrate) and a silicon layer (such as silicon nitride film, semiconductor layer, or silicon wafer) is high and peeling does not occur during a manufacturing process. Thus, a semiconductor can be manufactured stably.

Further, it is preferable to use a sputtering target obtained by reducing, rolling, and sintering a mixture made of one or more kinds of oxides selected from oxides of Al, Be, Ga, In, Ge, Ir, Pt, Re, Si, W, Ta, and Rh, an Ag oxide, and an Mo oxide.

By using such a sputtering target, a film can be formed stably at the time of sputtering.

BEST MODE FOR CARRYING OUT THE INVENTION

Figure 1:
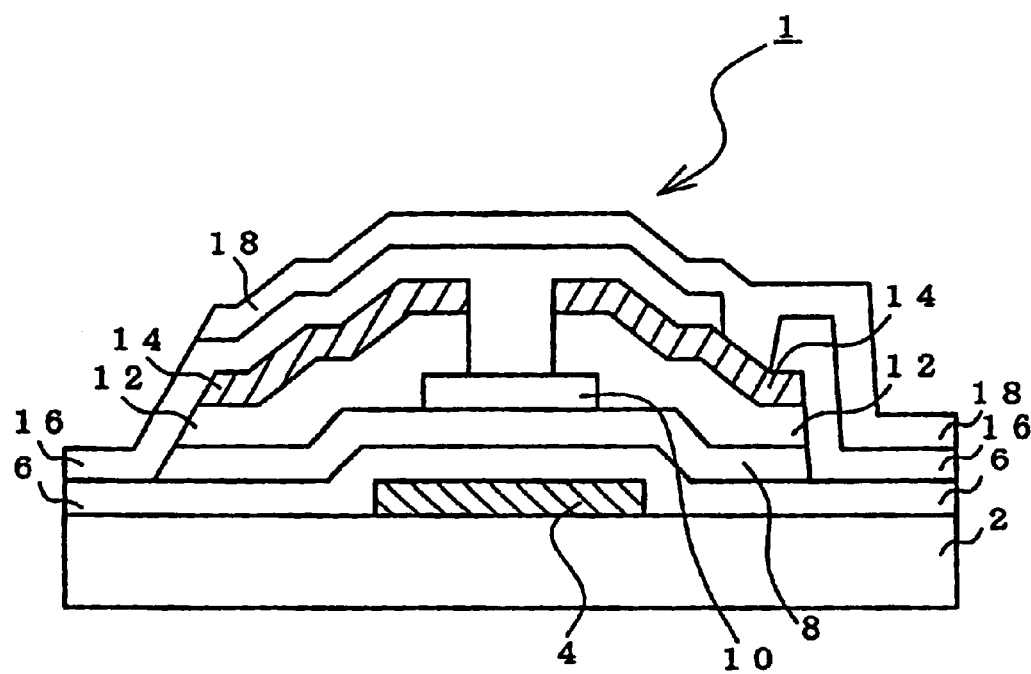
FIG. 1 is a cross sectional view showing an embodiment of a semiconductor device of the present invention.

A conductive thin film, a semiconductor device, and a method of manufacturing the same will be described hereinbelow.

1. Conductive Thin Film
(1) Kinds

A conductive thin film of the invention contains Ag atoms and Mo atoms. For example, a single Ag as an Ag atom source is used as a main component and an Mo atom is added to the Ag atom.

A Mo atom source is not particularly limited. Mo atoms may be added as single Mo atoms or as a alloy compounds a metal mixture, or a metal compound.

Examples are Mo/Al compounds, Mo/Be compounds, Mo/Ga compounds, Mo/Ge compounds, Mo/Ir compounds, Mo/Pt compounds, Mo/Re compounds, Mo/Si compounds, MoW alloys, MoTa alloys, MoRe alloys, and the like.

Examples of the Mo/Al compounds are $MoAl_{12}$, $MoAl_5$, $Mo_3Al_8$, and $Mo_3Al$. Examples of the Mo/Be compounds are $MoBe_{12}$, $MoBe_{22}$, $Mo_3Be$, and $MoBe_2$. Examples of the Mo/Ga compounds are $Mo_3Ga$ and $Mo_6Ga_{31}$. Examples of Mo/Ge compounds are $MoGe_2$, $Mo_2Ge_3$, $Mo_3Ge$, and $Mo_3Ge_2$. Examples of the Mo/Ir compounds are MoIr and $MoIr_3$. An example of Mo/Pt compound is $MoPt_3$. An example of the Mo/Re compound is MoRe. Examples of the Mo/Si compounds are $MoSi_2$, $Mo_3Si$, and $Mo_5Si_3$.

As a third component, another metal atoms may be added together with the Mo atoms to the Ag atoms.

The kind of the third component is not particularly limited as long as it is a metal which is not diffused into the silicon layer or a metal which does not exert an influence on the performance of a semiconductor device when it is diffused. Examples of such a component are Pd, W, Cu, and Au.

The addition amount of the third component is not particularly limited as long as it is in a range where no influence is exerted on the conductivity of the conductive thin film and the performance of the semiconductor device.

(2) Ratio

In the case of using the conductive thin film for an electrode, preferably, 0.5 to 70% by weight of Mo atoms is contained for the following reasons. When the content of Mo becomes lower than 0.5% by weight, an effect of adding Mo may not be displayed. On the other hand, when the content of Mo exceeds 70% by weight, there is a case that the resistance value of the gate electrode and that of the source/drain electrode increase or there is a case that abnormal discharge during sputtering increases.

For such reasons, it is most preferable to set the content of Mo atoms in a conductive thin film to 2 to 15% by weight.

(3) Resistivity

The resistivity of the conductive thin film is preferably 5 $\mu\Omega\cdot cm$ or less. The reason is that when the resistivity exceeds 5 $\mu\Omega\cdot cm$, delay in a signal for driving a liquid-crystal or the like may occur.

For such a reason, it is more preferable to set the resistivity of the conductive thin film to 3 $\mu\Omega\cdot cm$ less.

2. Method of Manufacturing Conductive Thin Film

A conductive thin film of the invention is formed by sputtering.

In this case, a sputtering method and a sputtering system are not particularly limited. Examples of the sputtering method are high-frequency sputtering, DC sputtering, RF sputtering, DC magnetron sputtering, RF magnetron sputtering, ECR plasma sputtering, and ion beam sputtering.

A sputtering target is not particularly limited as long as it is a target for forming a conductive thin film satisfying a target performance. Sputtering targets suitably used are, for example, a sputtering target obtained by reducing, rolling, and sintering a mixture of an Ag oxide and an Mo oxide, a sputtering target obtained by reducing, rolling, and sintering a mixture of one or more kinds of oxides selected from the group of Al, Be, Ga, In, Ge, Ir, Pt, Re, Si, W, Ta, and Rh, Ag oxide, and Mo oxide, a sputtering target obtained by inserting a plate made of Mo singly or an Mo alloy into an Ag target a part of which is cut and removed, and a sputtering target obtained by inserting a plate made of Ag singly into a target of single Mo or an Mo alloy a part of which is cut and removed. By using such a sputtering target, a film can be stably formed at the time of sputtering.

3. Semiconductor Device

The semiconductor device of the invention has a gate electrode and a source/drain electrode formed by the conductive thin film. The constitution (substrate, silicon layer, drive electrode, and the like) other than the gate electrode and/or the source/drain electrode is not particularly limited but can be made of normal materials.

In the invention, at least one of the gate electrode and the source/drain electrode may be formed by the conductive thin film. In this case, as a material of an electrode which is not formed by the conductive thin film, a normal material can be used. Further, in the case where wiring is necessary, from the viewpoint of the constitution of the semiconductor device, a conductive thin film may be used as wiring.

4. Method of Manufacturing Semiconductor Device

In the method of manufacturing the semiconductor device of the invention, at least one of the gate electrode and the source/drain electrode is formed from the conductive thin film formed by using the method of manufacturing the conductive thin film.

In this case, means for patterning the conductive thin film formed by sputtering into a target electrode shape is not particularly limited but may be performed by using photo-etching or the like.

Further, in the semiconductor device of the invention, the method of manufacturing components other than the electrodes is not limited but may be a normal method using a normal material.

EXAMPLES

The invention will be described in more detail hereinbelow on the basis of examples. However, the invention is not limited to the examples.

Example 1

A sputtering target obtained by opening a hole of 10 mmφ in an Ag target of 1.4 inches φ and inserting an Mo target of 10 mmφ into the hole was used and a thin film having a film thickness of 2,000 Å was formed on a silicon wafer by DC magnetron sputtering at a substrate temperature of 300° C. The content of Mo in the thin film was 5.1% by weight and resistivity was 2.4 μΩ·cm. Adhesion strength by a scratch test of the thin film was 5.57N. The scratch test was conducted as follows.

(1) Measurement Principle

A coated substrate is scratched with a diamond cone at constant speed while increasing a load at constant speed, and a destruction which occurs in or on the thin film is detected by an AE sensor. By using a load at which an AE signal rapidly goes high as a critical load, a quantitative value of adhesion strength is obtained.

By observing the surface after the scratch, a load of destruction (interface peel, film base material destruction, and the like) in a predetermined aspect is calculated.

In measurement of this time, as a result of surface observation after scratch, the substrate was exposed at the critical load value or less. Consequently, adhesion strength was calculated by the latter method.

(2) Apparatus and Measurement Conditions
scratch tester: Micro-Scratch-Tester manufactured by CSEM
scratch distance: 10.0 mm
scratch load: 0 to 10.0N
load rate: 10.0 N/min
scratch speed 10.0 mm/min
diamond cone shape: tip R: 200 μm (120°)

(3) Calculation of Adhesion Strength

A sample of each scratch test was observed by a light microscope. A point where a silicon wafer as a substrate is exposed was used as a peel point of the film and the distance from the scratch start point was measured, thereby calculating a peel load. The results are shown in Table 1.

Examples 2 to 4

Thin films were formed in a manner similar to Example 1 except that the content of Mo and the content of the third metal in the sputtering target were changed as shown in Table 1, and evaluation was made. The results are shown in Table 1.

Comparative Example 1

A thin film was formed in a manner similar to Example 1 except that the Mo target was not used but only the Ag target was used, and evaluation was made. The result is shown in Table 1.

TABLE 1

|  | Mo content (wt %) | The third metal content (wt %) | Resistivity (μΩ · cm) | Adhesion strength (N) |
|---|---|---|---|---|
| Example 1 | 5.1 | — | 2.4 | 5.57 |
| Example 2 | 2.1 | 0.5 (Cu) | 2.3 | 5.71 |
| Example 3 | 2.6 | 1.0 (In) | 2.7 | 5.84 |
| Example 4 | 2.5 | 0.6 (Ga) | 3.8 | 5.12 |
| Comparative example 1 | 0 | — | 2.1 | 0.40 |

Example 5

An embodiment of the invention will be described by using FIG. 1.

FIG. 1 is a cross sectional view showing an embodiment of a semiconductor device of the invention.

On a light transmittable glass substrate 2, a metal Ag (resistivity: 2.4 μΩ·cm) containing 5% by weight of Mo was deposited to a film thickness of 2,500 Å by high frequency sputtering. The layer was subjected to photoetching using a nitric acid-acetic acid-phosphoric acid solution as an etchant, thereby forming a gate electrode 4 (gate electrode wire) of a desired shape.

Next, a gate insulating film 6 as a first silicon nitride (SiNx) film (silicon layer) was deposited to a film thickness of 3,000 Å.

Subsequently, a $SiH_4$—$N_2$ mixed gas was used as a discharge gas and an α-Si:H(i) film (silicon layer) 8 was deposited to a film thickness of 3,500 Å.

Further, on the α-Si:H(i) film 8, by using an $SiH_4$—$NH_3$—$N_2$ mixed gas as a discharge gas, a second silicon nitride (SiNx) film was deposited to a film thickness of 3,500 Å. From the second SiNx film, a desired channel protective layer (silicon layer) 10 was formed by dry etching using a $CF_4$ gas.

Subsequently, an α-Si:H(n) film (silicon layer) 12 was deposited to a film thickness of 3,000 Å by using an $SiH_4$—$H_2$—$PH_3$ mixed gas.

The gate insulating film 6, α-Si:H(i) film (silicon layer) 8, channel protection layer (silicon layer) 10, and α-Si:H(n) film (silicon layer) 12 were deposited by glow discharge CVD.

After that, Ag (resistivity: 3.6 μΩ·cm) containing 2% by weight of $MoPt_3$ was deposited to a film thickness of 0.3 μm by sputtering. This layer was subjected to photoetching using a nitric acid-acetic acid-phosphoric acid solution as an etchant, thereby patterning a desired source/drain electrode 14.

Further, by performing both dry etching using a $CF_4$ gas and wet etching using a hydrazine ($NH_2NH_2.H_2O$) solution on the α-Si:H film, the pattern of the α-Si:H(i) film 8 and the pattern of the α-Si:H(n) film 12 were formed as desired patterns.

On the desired patterns, a source/drain insulating film (silicon layer) 16 as a third silicon nitride (SiNx) film was deposited to a film thickness of 3,000 Å by glow discharge CVD. At this time, a $SiH_4$—$NH_3$—$N_2$ mixed gas was used as a discharge gas to form the third SiNx film.

Further, by photoetching using the dry etching with the $CF_4$ gas, a desired through hole was formed as an output port of the gate electrode 4, an output port of the source electrode 14, and an electric contact point between the drain electrode 14 and a pixel electrode (drive electrode) 18.

After that, by making argon plasma act on the surface of the metal Ag electrode, the surface was cleaned. An amorphous transparent conductive film made of indium oxide and zinc oxide as main components was deposited by sputtering. As a target, an $In_2O_3$—ZnO sintered body in which the atom ratio [In/(In+Zn)] between In and Zn was adjusted to 0.83 and which is disposed in a planar magnetron cathode was used. By using, as a discharge gas, an argon gas obtained by mixing pure argon or an oxygen gas of a small amount of about 1% by volume, a transparent electrode film was deposited to a film thickness of 1,200 Å.

When the $In_2O_3$—ZnO film was analyzed by the X-ray diffraction method, no peak was observed and the film was amorphous. The film was patterned into the desired pixel electrode 18 and a lead electrode by photoetching using a solution of 3.4% by weight of oxalic acid and, further, a light shielding film pattern was formed, thereby completing an α-SiTFT substrate.

A TFT-LCD flat-panel display was manufactured by using the substrate. After that, when a video signal was input and display performance was checked, the display performance was excellent.

Comparative Example 2

Comparative Example 2 was carried out in a manner similar to Example 5 except that metal Al (resistivity: 7 $\mu\Omega\cdot cm$) containing 2% by weight of Nd was used for the Ag/Mo and Ag/Mo/Pt wires in Example 5. In the display performances of the case, color developed spots were generated in the vertical and lateral directions and it was recognized that a signal was not input normally.

Industrial Applicability

According to the invention, a conductive thin film for a semiconductor device having high adhesion strength to a base material, an insulating layer, and the like, the semiconductor device which operates stably without deteriorating performance, and the method of efficiently manufacturing the same can be provided.

What is claimed is:

1. A conductive thin film for a semiconductor device, containing Ag atoms and 1 to 30% by weight of Mo atoms.

2. The conductive thin film for a semiconductor device according to claim 1, which is a film comprising Mo atoms and Ag atoms and optionally any of Cu atoms, In atoms, and Ga atoms.

3. The conductive thin film for a semiconductor device according to claim 1, wherein a resistivity of the conductive thin film is 5 $\mu\Omega\cdot cm$ or less.

4. The conductive thin film for a semiconductor device according to claim 1, wherein the Mo atoms are Mo atoms derived from an Mo/Al compound, an Mo/Be compound, an Mo/Ga compound, an Mo/Ge compound, an Mo/Ir compound, an Mo/Pt compound, an Mo/Re compound, an Mo/Si compound, an MoW alloy, an MoTa alloy, or an MoRh alloy.

5. A method of manufacturing the conductive thin film for a semiconductor device according to claim 1, comprising forming the conductive thin film by sputtering.

6. The method of manufacturing the conductive thin film for a semiconductor device according to claim 5, wherein a sputtering target obtained by reducing, rolling, and sintering a mixture made of an Ag oxide and an Mo oxide is used.

7. The method of manufacturing a conductive thin film for a semiconductor device according to claim 5, wherein a sputtering target obtained by reducing, rolling, and sintering a mixture made of one or more kinds of oxides selected from oxides of Al, Be, In, Ga, Ge, Ir, Pt, Re, Si, W, Ta, and Rh, an Ag oxide, and an Mo oxide is used.

8. A semiconductor device comprising a gate electrode and a source/drain electrode, wherein at least one of the gate electrode and the source/drain electrode is formed of a semiconductor device conductive thin film containing Ag atoms and 1 to 30 wt. by weight of Mo atoms.

9. A method of manufacturing the semiconductor device according to claim 8, comprising forming at least one of a gate electrode and a source/drain electrode by a conductive thin film formed by using the method of manufacturing a conductive thin film for a semiconductor device according to claim 3.

10. The conductive thin film for a semiconductor device according to claim 3, wherein the resistivity of the conductive thin film is 3 $\mu\Omega\cdot cm$ or less.

11. The conductive thin film for a semiconductor device according to claim 1, wherein the Mo atoms are present in an amount of 2 to 15% by weight.

* * * * *